United States Patent
Shimizu et al.

(10) Patent No.: US 7,525,144 B2
(45) Date of Patent: Apr. 28, 2009

(54) INSULATING FILM AND SEMICONDUCTOR DEVICE

(75) Inventors: Tatsuo Shimizu, Shinagawa-ku (JP); Noburu Fukushima, Suginami-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 11/689,212

(22) Filed: Mar. 21, 2007

(65) Prior Publication Data

US 2007/0228526 A1  Oct. 4, 2007

(30) Foreign Application Priority Data

Mar. 30, 2006  (JP)  .............................. 2006-095234

(51) Int. Cl.
 *H01L 29/94* (2006.01)
(52) U.S. Cl. .................. 257/310; 257/410; 257/632; 257/E29.162
(58) Field of Classification Search ................. 257/310, 257/410, 632, E29.162
See application file for complete search history.

(56) References Cited

U.S. PATENT DOCUMENTS

| 7,091,568 B2 * | 8/2006 | Hegde et al. ................. 257/410 |
| 2005/0224897 A1 * | 10/2005 | Chen et al. ................... 257/410 |
| 2006/0267066 A1 * | 11/2006 | Li et al. ....................... 257/310 |
| 2008/0182427 A1 * | 7/2008 | Oberbeck et al. ........... 438/785 |

FOREIGN PATENT DOCUMENTS

| JP | 2003-289140 | 10/2003 |
| JP | 2005-259954 | 9/2005 |
| JP | 2005-311300 | 11/2005 |

* cited by examiner

*Primary Examiner*—Trung Dang
(74) *Attorney, Agent, or Firm*—Oblon, Spivak, McClelland, Maier & Neustadt, P.C.

(57) ABSTRACT

An insulating film includes an oxide of a metal selected from Hf and Zr, the oxide being doped by at least one of Ba, Sr and Mg. And the insulating film satisfies the following formula (1):

$$0.06 \text{ at \%} \leq [Ba]+[Sr]+[Mg] \leq 1.4 \text{ at \%} \quad (1)$$

wherein [Ba] represents atomic % of Ba, [Sr] represents atomic % of Sr, and [Mg] represents atomic % of Mg.

20 Claims, 7 Drawing Sheets

FIG. 1

EXPLANATION OF ABBREVIATED SYMBOLS

Ec: BOTTOM OF CONDUCATION BAND (CB)

$\Delta$Ec: OFFSET

Si    HfO$_2$ $\Delta$Eg: BAND GAP $\Delta$Ev: OFFSET

Ev: TOP OF VALANCE BAND (VB)

INSULATING FILM AND SEMICONDUCTOR DEVICE

CROSS-REFERENCE TO RELATED APPLICATIONS

This application is based on and claims priority under 35 U.S.C. 119 from Japanese Patent Application No. 2006-095234 filed Mar. 30, 2006.

BACKGROUND

1. Technical Field

The present invention relates to an insulating film and a semiconductor device having a field-effect transistor made by using the same.

2. Related Art

In order to ensure the amount of an electrical charge induced in the channel of a MISFET (metal-insulator- semiconductor field-effect transistor), it has been usual practice to employ a gate insulating film having a small thickness and thereby increase the capacitance of the transistor. As a result, a reduction has been accelerated in the thickness of a $SiO_2$ film used as the gate insulating film and its thickness is now nearly as low as much less than 1 nm.

However, the gate-leakage current of a $SiO_2$ film is so large that the dissipation of standby energy makes power consumption incontrollable. For example, the gate-leakage current of a $SiO_2$ film having a thickness of 0.8 nm is as much as 1 $kA/cm^2$ and presents a serious problem in respect of power consumption.

A large film thickness is effective for low power consumption. Accordingly, studies have been made to use a substance having a high dielectric constant (high-K dielectric) to make an insulating film which can realize a large electrical charge, even if its thickness may be larger than that of a $SiO_2$ film.

There are known metal oxides for stable insulating films having a high dielectric constant, including $HfO_2$, $ZrO_2$ and silicates thereof ($HfSiO_4$ and $ZrSiO_4$) as particularly promising materials.

However, it has been a drawback of those high-K dielectric metal oxides that they tend to include oxygen vacancies easily. The presence of oxygen vacancies makes it difficult to realize a reduction of leakage current, since a level thereby caused occurs in a band gap. Although no satisfactory solution has been found for those problems as yet, several proposals have been made.

A first proposal lies in the use of nitride such as HfON, ZrON, HfSiON or ZrSiON (reference is made to JP-A-2005-258854 (the term "JP-A" as used herein means an "unexamined published Japanese patent application")).

A second proposal lies in the use of a ternary metal oxide, e.g., an aluminate such as HfAlO or ZrAlO (reference is made to JP-A-2005-311300).

There is also known a film of silicate ($HfSiO_4$ or $ZrSiO_4$) having a metal element concentration of 17 at % or less and containing 1 at % or more of Mg or the like (reference is made to JP-A-2003-289140).

As a result of our serious study, we, the inventors of the present invention, have discovered the following facts.

The problem of the leakage current of a film of $HfO_2$, $ZrO_2$ or the silicate thereof (HfSiO or ZrSiO) does not essentially reside in the oxygen vacancy itself, but resides in the lack of charge compensation for the oxygen vacancy and the mobility of the oxygen vacancy.

As a result of the free movement of the oxygen vacancy for which no charge compensation is made, the following problems occur:

(1) The mobile oxygen vacancy acts as a trigger to facilitate the precipitation of a crystal from the amorphous state and thereby makes it impossible to guarantee the uniform properties of the insulating film (problem of phase separation and crystallization);

(2) The oxygen vacancy for which no charge compensation is made causes a level to occur in a band gap in the vicinity of Ec and form a source for leakage current (problem of leakage current caused by the oxygen vacancy); and (3) The movement of the oxygen vacancy gives rise to a structural defect affecting long-term reliability (problem of reliability).

None of those problems would occur if charge compensation were made for any oxygen vacancy in a film of $HfO_2$, $ZrO_2$ or a silicate thereof, and if the oxygen vacancy were fixed.

However, none of the proposals hitherto made has been able to solve any of the problems (1) to (3), as will be discussed below.

Referring to the first proposal relying on nitride, nitrogen has only a small power of fixing any oxygen vacancy and a large amount of nitrogen is required for suppressing crystallization. However, the use of a large amount of nitrogen brings about a seriously narrowed band gap. For example, the band offset ΔEc between the conduction band and the silicon substrate drops by nearly 1.0 eV and the band offset ΔEv between the valence band and the silicon substrate drops by about 0.5 to 1.5 eV. Accordingly, a seriously increased leakage current occurs, though the amorphous state may be maintained. Nitriding also presents a problem in respect of long-term reliability. The introduction of nitrogen usually brings about an increase in oxygen vacancy. However, as nitrogen cannot fix any oxygen vacancies satisfactorily, the movement of the oxygen vacancy produces a structural change in a long period of time. The structural change is accompanied by a fixed charge and fixed polarization and thereby brings about a serious worsening in dielectric properties.

As regards the second proposal relying on an aluminate film, aluminum has only a small power of fixing any oxygen vacancy and a large amount of aluminum is required for suppressing crystallization. The use of a large amount of aluminum brings about a serious drop of ΔEc and an increased leakage current. In order to fix any oxygen vacancy with a trivalent cation additive, it is generally necessary for two added elements and the oxygen vacancy to form a complex (for example, when Al is added, a complex expressed as "Al-Vo-Al", where Vo stands for oxygen vacancy), the formation of such a complex on the whole film requires a considerably large amount of heat (i.e. a high temperature for a long time). An incomplete complex, such as Al-Vo, is also formed and forms a new charge source. That is one of the reasons why aluminum has only a small power of fixing any oxygen vacancy. Another problem is that aluminum facilitates phase separation and crystallization, since $Al_2O_3$ is stable in terms of energy, and since Al has a very small ion radius as compared with Hf or Zr. As the introduction of aluminum results in a large amount of oxygen vacancies, mobile oxygen vacancies facilitate phase separation. Moreover, the use of a large amount of aluminum causes various levels to be produced in the band gap by oxygen vacancies and structural changes, thereby bringing about a serious worsening in properties of the insulating film.

Therefore, it has been difficult to reduce by employing those methods the leakage current of a film of $HfO_2$, $ZrO_2$ or a silicate thereof without impairing its original properties. It has been impossible to produce an insulating film which can fix any oxygen vacancy powerfully, while not causing any narrowing of the band gap.

SUMMARY

Under these circumstances, an object of the present invention is to provide an insulating film allowing only a small amount of leakage current.

(1) According to a first aspect of the present invention, an insulating film comprising an oxide of a metal selected from Hf and Zr, the oxide being doped by at least one of Ba, Sr and Mg; and satisfying the following formula (1):

$$0.06 \text{ at }\% \leq [Ba]+[Sr]+[Mg] \leq 1.4 \text{ at }\% \quad (1)$$

wherein [Ba] represents atomic % of Ba, [Sr] represents atomic % of Sr, and [Mg] represents atomic % of Mg.

(2) According to a second aspect of the present invention, an insulating film comprising a silicate of a metal selected from Hf and Zr, the silicate being doped by at least one of Ba, Sr and Mg; and satisfying the following formula (3):

$$0.06 \text{ at }\% \leq [Ba]+[Sr]+[Mg] \leq 1.4 \text{ at }\% \times [M]/\{[M]+[Si]\} \quad (3)$$

wherein [Ba] represents atomic % of Ba, [Sr] represents atomic % of Sr, [Mg] represents atomic % of Mg, [M] represents atomic % of one of the Hf and Zr, and [Si] represents atomic % of Si.

(3) According to a third aspect of the present invention, a semiconductor device includes: a semiconductor substrate; an insulating layer comprising an insulating film according to the item (1) or (2), and provided on the semiconductor substrate; a gate electrode provided on the insulating layer; and source and drain regions between which a region below the gate electrode is held on the surface of the semiconductor substrate.

(4) According to a fourth aspect of the present invention, a semiconductor device comprising: a first electrode; an insulating layer comprising the insulating film according to the item (1) or (2), and provided on the first electrode; and a second electrode provided on the insulating layer.

(5) According to a fifth aspect of the present invention, a semiconductor device includes: a semiconductor substrate; a first insulating layer provided on the semiconductor substrate; a first electrode provided on the first insulating layer; a second insulating layer provided on the first electrode; a second electrode provided on the second insulating layer; and source and drain regions between which a region below the first insulating layer is held on the surface of the semiconductor substrate, wherein at least one of the first and second insulating layers comprise an insulating film according to the item (1) or (2).

(6) According to a sixth aspect of the present invention, a semiconductor device includes: a semiconductor substrate; a first insulating layer provided on the semiconductor substrate; a second insulating layer provided on the first insulating layer; a third insulating layer provided on the second insulating layer; a controlling electrode provided on the third insulating layer; and source and drain regions between which a region below the first insulating layer is held on the surface of the semiconductor substrate, wherein at least one of the second and third insulating layers comprise an insulating film according to the item (1) or (2).

BRIEF DESCRIPTION OF THE DRAWINGS

Exemplary embodiment of the present invention will be described in detail based on the following figures, wherein.

DETAILED DESCRIPTION

Several modes of carrying out the present invention will now be described with reference to drawings. The same symbols will be used to denote structural members which are common to all the modes, and no repeated description thereof will be made. All of the drawing figures are schematic diagrams for assisting the description of the invention and its understanding, and though the shapes, dimensions, ratios, etc. shown therein may differ from what they are in an actual device, an adequate change in design can be made in accordance with the following description and the prior art.

The mode of carrying out the invention which will now be described is characterized by adding at least one substance selected from Ba, Sr and Mg to a film of e.g. hafnia, zirconia, hafnium silicate or zirconium silicate ($HfO_2$, $ZrO_2$, $HfSiO_4$ or $ZrSiO_4$)

Increase of Oxygen Vacancies by Additives

In the insulating film according to the mode of the invention under description, both of the matrix metals Hf and Zr are tetravalent, while the additive elements Ba, Sr and Mg are all divalent. Therefore, the insulating film according to the mode of the invention under description is a product obtained by adding a substance having a smaller valence than that of the matrix metal, and the following is an explanation of the change in the component substances.

The substitution of a component element forming an oxide and having a positive valence (hereinafter referred to simply as component element) by a substance having a smaller valence results in a reduction of the positive charge. As a result, oxygen is released and oxygen vacancies are formed, so that the whole system is held electrically neutral. It is obvious therefrom that the number of oxygen vacancies increases with the amount of the additive. In the most stable state, the amount of any of the additive elements Ba, Sr and Mg and the amount of oxygen vacancies are equal to each other.

Description will now be made by comparing an additive element Ba, Sr or Mg having a valence of 2 and an additive element N having a valence of −3. Ba, Sr or Mg substitutes a cation site (Hf site). N substitutes an anion site (O site). As the substitution of Hf having a valence of +4 by Ba, Sr or Mg having a valence of +2 results in a reduction of +, oxygen having a valence of −2 is released to bring about a reduction of −. As the substitution of O having a valence of −2 by N having a valence of −3 results in an increase of −, oxygen is released for a reduction of −. In either event, therefore, oxygen vacancies are formed, though by entirely different mechanisms.

As regards the amount, the introduction of M (Ba, Sr or Mg) having a valence of +2 results in a reduction of +2 and oxygen is released to bring about a reduction of −2, and therefore, [M]=[Vo]. The introduction of two nitrogen elements N each having a valence of −3 results in an increase of −1 (the difference in valence between nitrogen and oxygen is −1)×2, thereby forming one oxygen vacancy, and therefore, [N]=2[Vo]. In other words, the amount of nitrogen is twice as large as that of oxygen vacancies.

Power of Fixing Oxygen Vacancies

For the insulating film according to the mode of the invention under description, which already has oxygen vacancies, it is important to suppress the mobility of the oxygen vacancies and it is, therefore, important for any additive element to have a power of fixing oxygen vacancies.

The energy gained by each element, nitrogen, Ba, Sr or Mg, when fixing oxygen vacancy was estimated by first-principles calculation (see Table 1). It was estimated by calculating a difference in energy between when oxygen vacancy and e.g. Ba were introduced into $HfO_2$ and fixed in closest proximity to each other, and when oxygen vacancy and Ba (or Sr or Mg) existed in $HfO_2$ independently of each other.

| Additive element | Energy gain (eV) |
|---|---|
| N | 0.26 |
| Ba | 1.5 |
| Mg | 1.4 |
| Sr | 1.3 |
| Ca | 0.1 |
| Y | 0.1 |

Table 1 confirms that the presence of oxygen vacancy in closest proximity is an advantage in terms of energy for any of nitrogen (0.26 eV), Ba (1.5 eV), Mg (1.4 eV) and Sr (1.3 eV). As far as nitrogen was concerned, however, its fixing power was found to be equal to 20% or less of that of Ba, Mg or Sr. The same calculations were made for Ca and Y and revealed that they had a fixing power of only about 0.1 eV and could hardly suppress the movement of oxygen vacancy.

The first-principles calculations were made by employing ultrasoft pseudo-potentials (D. Vanderbilt, Phys. Rev. B41 7892 (1990)). They were density-functional calculations made within the range of local density approximation. The potentials employed for the calculations, such as Hf, O, N, Ba, Sr, Ca and Mg, have already been used in various ways and are highly reliable. For example, the lattice constant of $HfO_2$ as calculated (a0=9.55 Bohr=5.052 A) is only about 0.55% less than its experimental value (9.603 Bohr=5.08 A), and is satisfactory. According to the present invention, the calculation is based on the fluorite type $HfO_2$ structure. When a 96-atom unit cell measuring 2a×2a×2a is, for example, used for the lattice constant a, 8 k-points are used for the calculation of its BZ (Brillouin zone) and the energy cutoff is 30.25 Ryd (1 Ryd=13.6058 eV).

Electronic State of BaVo and NVON

Figure 1:
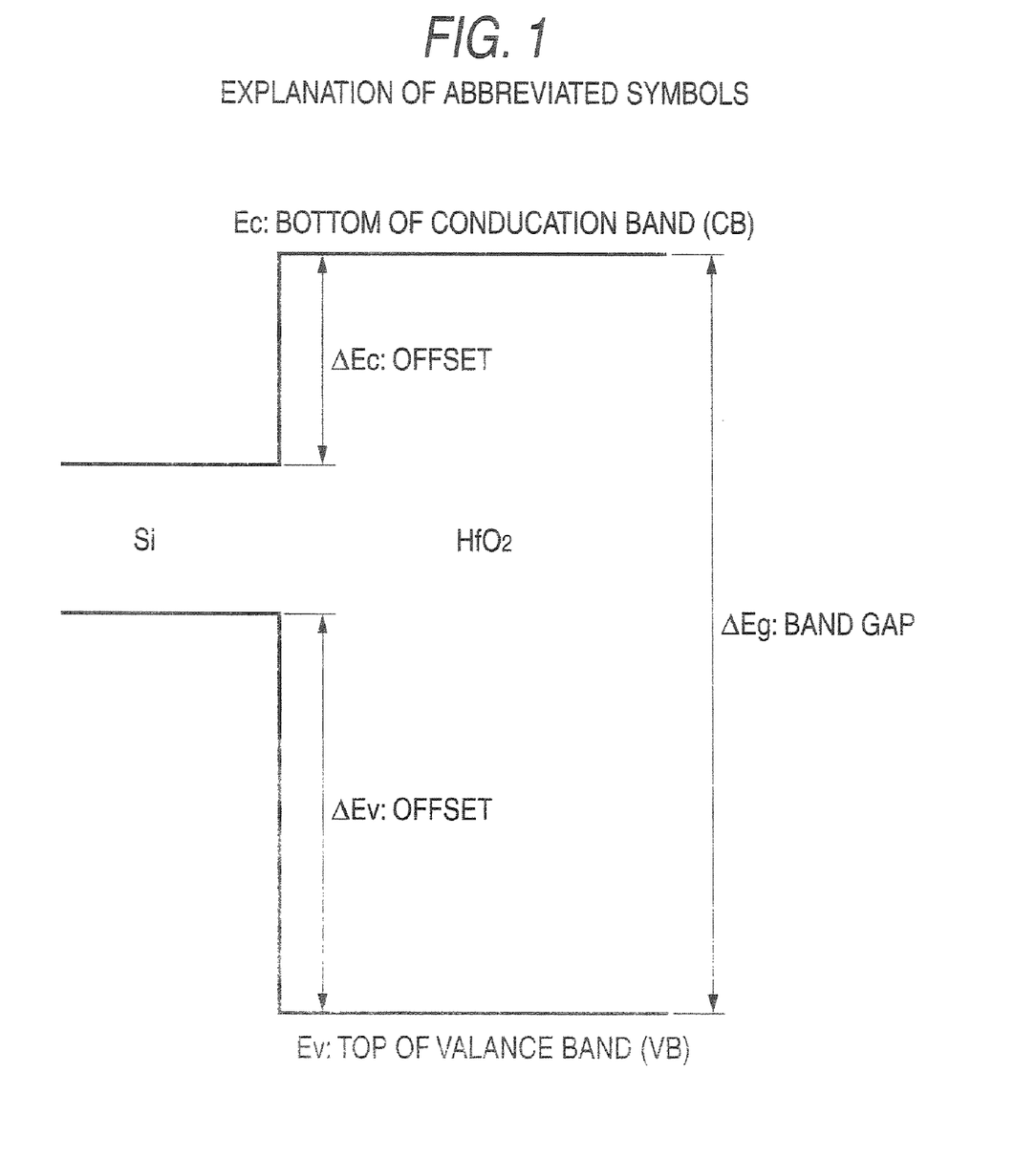
FIG. 1 is a schematic diagram explaining the abbreviated symbols used for describing the electronic state.
Figure 2:
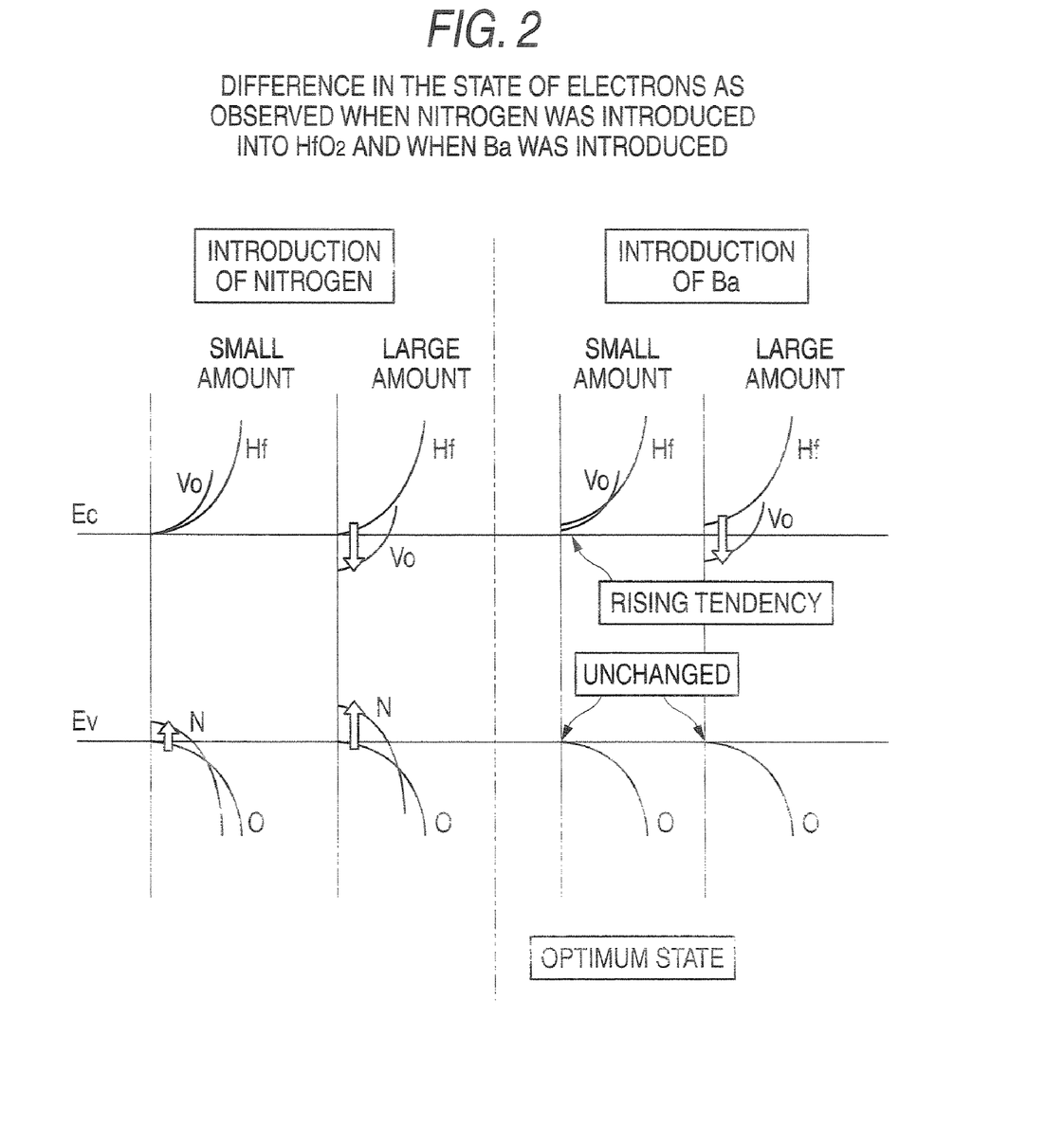
FIG. 2 is a schematic diagram explaining a difference in the electronic state as observed when nitrogen was introduced into $HfO_2$ and when Ba was introduced.

Reference is made to FIG. 2 for comparing Ba and nitrogen in respect of the electronic state in a film of $HfO_2$. The symbols used in connection with the mode of the invention under description are explained in FIG. 1.

When two nitrogen atoms and one oxygen vacancy are introduced into HfO2 in a large unit cell, the bottom Ec of the conduction band (CB) does not change, as shown in the leftmost part of FIG. 2. It is apparent that the bottom of the conduction band (CB) does not change, since there is no interaction between oxygen vacancies when a small amount of nitrogen has been introduced. However, a rise in Ev is unavoidable even in a region of low density.

On the other hand, it has for the first time been ascertained by our first-principles calculation that the bottom Ec of the conduction band (CB) drops largely when a large amount of nitrogen is introduced. Its essence resides in the "interaction between oxygen vacancies".

The second part from the left of FIG. 2 shows the electronic state prevailing when a large amount (16.7 at % or more) of nitrogen is introduced. This causes the bottom Ec of the conduction band (CB) to drop. This is due to the bonds of excess Hf atoms occurring from the formation of oxygen vacancy. The interaction between the bonds of Hf atoms causes the bonds to form a band and thereby a source for a drop of Ec. Our calculation in the range of interaction teaches that there is a sudden change in Ec when one oxygen vacancy is formed by ejecting one oxygen from every eight oxygen atoms. This corresponds to the case where the amount of nitrogen is 16.7 at %, while the amount of oxygen vacancies is 8.3 at %.

A more serious problem is that the introduction of nitrogen causes the top Ev of the valence band (VB) to rise. A rise in Ev of about 1.0 eV is observed. This is a serious problem as the hole leakage current.

As nitrogen has only a weak power of fixing oxygen vacancy, it is necessary to introduce a considerably large amount of nitrogen in order to withstand heat treatment at a high temperature. Even the process of the lowest temperature (about 400° C.) among the current heat processes for semiconductors prefers nitrogen in the amount of 16.7 at % or more corresponding to the amount of one or more oxygen vacancies in every eight oxygen atoms. If the amount of nitrogen is smaller, phase separation and crystallization start in the heat process.

The structure which is most stable when a large amount of nitrogen is introduced is in the state where two nitrogen atoms are in closest proximity to oxygen vacancy (locally the "NVoN structure"). The formation of the NVON structure requires a long time of annealing at a high temperature and $HfO_2$ containing nitrogen requires a considerably large amount of heat to form a stable film.

Accordingly, it has been necessary to introduce a large amount of nitrogen to withstand heat treatment at a high temperature and the stabilization of $HfO_2$ containing a large amount of nitrogen has required a long time of heat treatment, which has been a process of low productivity. Moreover, it is obvious that even if stable $HfO_2$ may be obtained, a narrower band gap and an increased leakage current are unavoidable, since both ΔEc and ΔEv drop.

Discussion will now be made of the electronic state obtained by the introduction of Ba (or Sr or Mg) which has been found to have a four to five times stronger oxygen vacancy fixing power than that of nitrogen.

When a small amount (8.3 at % or less) of Ba (or Sr or Mg) is introduced, Ec does not drop, but rather shows a rising tendency, as shown in the second part from the right of FIG.

2. Complexes of Ba atom and oxygen vacancy Vo (BaVo) are formed and react against one another. On the other hand, Ev is desirably not affected by Ba.

When a large amount of Ba (over 8.3 at %) is introduced, a level occurs in the band gap and causes the bottom Ec of the conduction band (CB) to drop, as shown in the rightmost part of FIG. 2, as when nitrogen is introduced. On the other hand, Ev is desirably not affected by Ba.

When Ba is employed, it is possible to make the amount of oxygen vacancies coincide with the amount of Ba which is added, if a film is formed in a reducing atmosphere, or at a low oxygen partial pressure (for example, in an argon gas, or in the absence of any oxygen partial pressure). Moreover, the BaVo structure is easy to obtain, since it is only oxygen in proximity to Ba that is released.

As is obvious from the foregoing, the introduction of Ba means the introduction of oxygen vacancy and it is, therefore, believed that the introduction of any element as according to the mode of the invention under description has never been considered in the formation of any insulating film. It has hitherto been considered better not to introduce Ca (divalent) or Y (trivalent) into $HfO_2$ or $ZrO_2$, since those elements form oxygen vacancy and thereby an ionic conductor.

However, it has for the first time been found through out research work that the formation of oxygen vacancy does not present any problem at all, since charge compensation is possible, and since the levels of Ba and oxygen vacancy are swept away from the band gap. In that sense, the introduction of Ba has been an entirely counterintuitive idea. Hf is coordinated by eight oxygen atoms and Ba by seven oxygen atoms. It is to be remembered that the formation of a film in an oxygen atmosphere as is usually conceivable results in the suppression of oxygen vacancy and the formation of a p-type semiconductor film.

Moreover, about 0.01 at % or less of oxygen vacancy is formed in $HfO_2$ (or $ZrO_2$) or a silicate composed mainly of $HfO_2$ (or $ZrO_2$) and forms a source for a fixed charge. The use of a film thereof as a gate insulating film results in the occurrence of remote Coulomb scattering and the lowering of mobility. However, the formation of BaVo (or MgVo or SrVo) by introducing Ba (or Mg or Sr) as according to the mode of the invention under description makes it possible to complete local charge compensation and thereby cancel any scattering by a fixed charge. Although it has hitherto been difficult to employ a film of $HfO_2$ as a gate insulating film, the insulating film according to the present invention provides a good film not undergoing any lowering in mobility.

Amount of Additive Element

The larger the amount of the element which is added, the larger fixing power tends to be obtained. However, the amount required to fix oxygen vacancy differs from one element to another. The amount of 16.7 at % or more has been required for nitrogen. On the other hand, about 1.0 at % is satisfactory for e.g. Ba, as will be described in detail.

Figure 3:
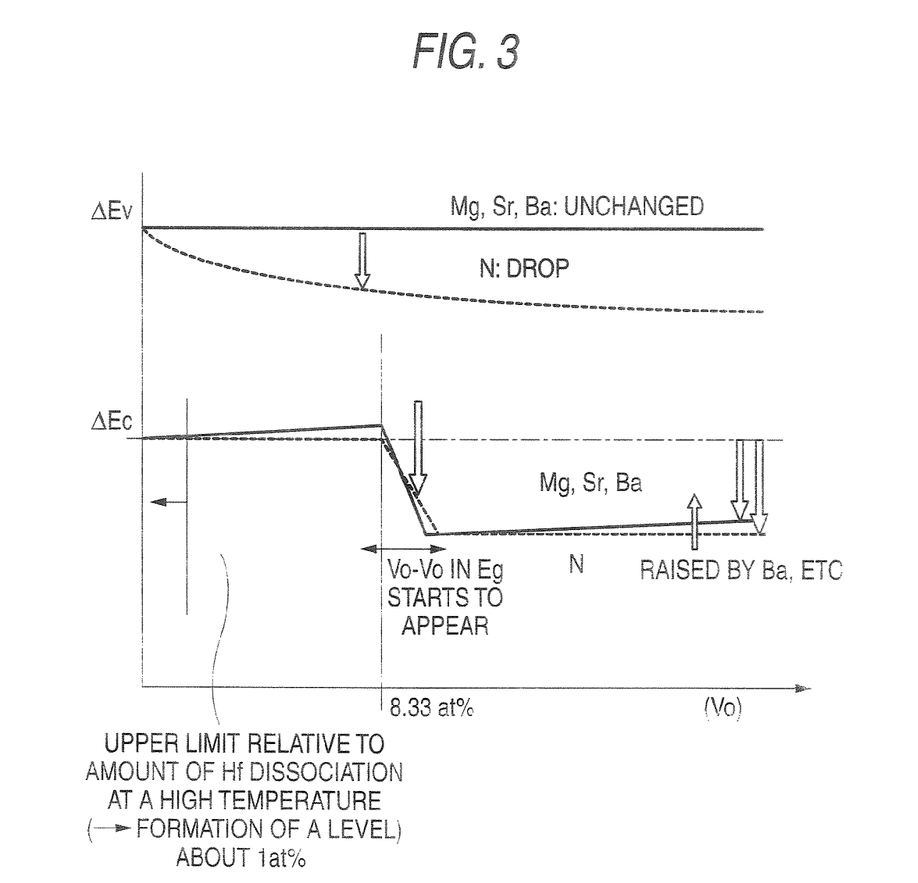
FIG. 3 is a schematic diagram showing the band offsets as observed when Mg, Sr, Ba and nitrogen were introduced.

FIG. 3 is a diagram showing the amounts of the band offset as observed after the introduction of Mg, Sr or Ba (as shown by solid lines in FIG. 3) and nitrogen (as shown by broken lines in FIG. 3). The vertical axis represents the amounts of band offset ΔEv and ΔEc, while the horizontal axis represents the amount of oxygen vacancies [Vo]. The amount of Mg, Sr or Ba as introduced is equal to [Vo], while the amount of N is twice as large as [Vo].

The value of ΔEv is lower when nitrogen is introduced, than when Mg, Sr or Ba is introduced. The value of ΔEc drops sharply irrespective of the element when the amount of oxygen vacancies [Vo] exceeds 8.33 at %. This is due to the interaction between oxygen vacancies Vo.

In this connection, the problem is that nitrogen has only a weak power of fixing oxygen vacancies. The heat process for semiconductors requires the amount which enables the amount of oxygen vacancies to be fully in excess of 8.33 at % (16.7 at % in terms of nitrogen). This means the presence of two nitrogen atoms in each 1×1×1 crystal lattice unit. However, it also means a drop of about 1.0 eV for both ΔEc and ΔEv. Therefore, nitrogen can be employed only when the fixing of oxygen vacancies or the reduction of leakage current is abandoned.

Ba, Sr or Mg has a satisfactory fixing power if one atom is present in each 5×5×5 crystal lattice unit and it is satisfactory for Ba to be present in the amount of 0.06 at % when the heat process is carried out at 800° C. As its fixing power, of course, depends on the temperature of the heat process, Ba is preferably present in the amount of 0.13 at % or more when the heat process is carried out at a temperature over 1,050° C.

If the amount of Ba (or Sr or Mg) is too large, the dissociation of BaVo occurs at a high temperature. Its absolute amount has to be reduced, since its dissociation produces a level in the gap. BaVo has so strong a binding power that its dissociation hardly occurs. The probability of its dissociation is $10^{-4}$ or less even at a temperature as high as 1,050° C., and it can be concluded that there is no increase of leakage current if the amount of Ba is 1.0 at % or less. As BaVo has a lower probability of dissociation at a temperature of 800° C., it would be possible to increase Ba to 1.4 at % without causing any increase in leakage current. If the process temperature can be lowered to 400° C., Ba can be increased to 1.9 at %, but, at the present, the propriety of its increase is difficult issue in view of post annealing and working environment. That may be possible in the future.

The probability of dissociation of BaVo was examined as will now be described. A large amount of Sr (about 5 at %) was introduced and annealing was carried out at 1,050° C. A study of coordination numbers was made at an EXAFS count rate increased by the introduction of a large amount of Sr and revealed 1 of 8-coordination as counted against 10,500 of 7-coordination. Thus, the dissociation probability was determined as about $10^{-4}$. When Ba or Mg is employed, a still lower dissociation probability is expected, since a larger amount of energy is fixed.

When the amount of the added element is from 0.13 to 1.0 at %, the insulating film maintains its amorphous state when annealed at a temperature of 1,050° C. or above, and no narrowing of the band gap occurs, nor is any level formed in the gap. When the amount of the added element is from 0.06 to 1.4 at %, the insulating film maintains its amorphous state when annealed at a medium temperature of 800° C. Its leakage current characteristics are markedly improved (or it exhibits its original properties again) and its long-term reliability is dramatically improved.

Although the addition of a considerably large amount is required of any ordinary dopant as in the case of nitrogen, the combination according to the present invention enables only a very small amount to produce a remarkable result. Another advantage of the combination is that it permits film forming and post-annealing in a reducing atmosphere at a temperature as high as 1,050° C. and does not produce any interfacial film having a low dielectric constant.

The amounts which are added are represented by the following formulae. Formula (1) represents the amount of hafnia or zirconia withstanding annealing at 800° C., and Formula (2) represents the amount of hafnia or zirconia withstanding annealing at 1,050° C.

$$0.06 \text{ at \%} \leq [Ba]+[Sr]+[Mg] \leq 1.4 \text{ at \%} \quad (1)$$

$$0.13 \text{ at \%} \leq [Ba]+[Sr]+[Mg] < 1.0 \text{ at \%} \quad (2)$$

In Expressions (1) and (2), [Ba] stands for atomic % of Ba, [Sr] stands for atomic % of Sr and [Mg] stands for atomic % of Mg. It is preferable from the standpoint of device controllability to add only one kind of element.

The problem of dissociation is associated only with $HfO_2$ (or $ZrO_2$), and when a silicate is employed, an upper limit is defined by the value corresponding to the amount of $HfO_2$ (or $ZrO_2$). Therefore, the ratio [Hf]/{[Hf]+[Si]} is multiplied by the upper limit 1.4 at % (800° C.) or 1.0 at % (1,050° C.). Thus, [Hf]/{[Hf]+[Si]}×1.4 at % or [Hf]/{[Hf]+[Si]}×1.0 at %.

They can be represented by the following formulae. Formula (3) represents the amount of hafnium or zirconium silicate withstanding annealing at 800° C. and Formula (4) represents the amount of hafnium or zirconium silicate withstanding annealing at 1,050° C.

$$0.06 \text{ at \%} \leq [Ba]+[Sr]+[Mg] \leq 1.4 \text{ at \%} \times [M]/\{[M]+[Si]\} \quad (3)$$

$$0.13 \text{ at \%} \leq [Ba]+[Sr]+[Mg] \leq 1.0 \text{ at \%} \times [M]/\{[M]+[Si]\} \quad (4)$$

In the formulae (3) and (4), [Ba] stands for atomic % of Ba, [Sr] stands for atomic % of Sr, [Mg] stands for atomic % of Mg, [M] stands for atomic % of Hf or Zr and [Si] stands for atomic % of Si. It is preferable from the standpoint of device controllability to add only one kind of element.

The introduction of silicon is mainly intended for maintaining the film in the amorphous state, enlarging the band gap and improving its compatibility with an interfacial film having a low dielectric constant at the sacrifice of its dielectric constant. However, the introduction of an additive, such as Ba, according to the mode of the invention under description presents a problem of balance between the magnitude of the band gap and the dielectric constant.

The band gap of $HfO_2$ is about 5.4 eV, that of $SiO_2$ is about 9.0 eV and that of $HfSiO_4$ is approximately a proportional division on a quantity ratio. At present, 5.4 eV of $HfO_2$ is considered satisfactory. It is, however, likely that a somewhat larger gap may be required in the future. In that sense, the region below 1 (silicate) is still important. As a dielectric constant closer to that of $HfO_2$ is preferred, [M]/{[M]+[Si]} is preferably over 0.5 and close to 1. More specifically, [M]/{[M]+[Si]} is preferably 0.7 or more and more preferably 0.9 or more.

Oxygen Vacancy and Density of Additive Element

A brief summary will now be made of oxygen vacancy and the density of the additive. A 1×1×1 crystal lattice unit contains four units of HfO2. In other words, it contains four Hf and eight oxygen atoms, or a total of 12 atoms. When one of the oxygen atoms becomes a vacancy, or when two oxygen atoms are substituted by nitrogen, the amount of oxygen vacancy is 1/12×100=8.33 at %, or the amount of nitrogen is 2/12×100=16.7 at %. Although discussion is herein made on a unified basis by regarding oxygen vacancy as an atom, an experiment requires conversion, since oxygen vacancy cannot be counted. In this case, conversion is made by employing 12−1=11 atoms as a denominator. For example, the concentration of nitrogen added in an experiment is 2/11×100=18.2 at %. According to the mode of the invention under description, the calculated density of the additive is defined by regarding oxygen vacancy as an atom and the value as defined is employed for the description of a detailed mechanism. No detailed discussion as herein made is possible unless the concept of the amount of oxygen vacancy is employed. Conversion can be made by employing [N]=2[Vo] when introducing nitrogen, or [Ba]=[Vo] when introducing Ba (or Sr or Mg). [Experiment N]=[N] X100/(100−[N]/2) and [Experiment Ba]=[Ba]×100/(100−[Ba]).

Several specific examples will be given. When [Ba]=1.4 at %, good coincidence is obtained, as [Experiment Ba]=1.4 at %×100/(100−1.4)=1.4 at %. When [Ba]=2.0 at %, good coincidence is obtained, as [Experiment Ba]=2.0 at %×100/(100−2.0)=2.0 at %. Therefore, perfect coincidence can be obtained for the value of 2.0 at % or less falling within the range of the present invention, and no conversion is necessary. However, the addition of a higher proportion will require conversion to enable the description herein made to be reflected on an experiment.

State of Added Element in a Film

The added element, such as Ba, is considered to substitute Hf or Zr and form a seven-coordinate compound. It has for the first time been found that while Ba (or Sr or Mg) oxide is usually six-coordinate, it forms a seven-coordinate compound in $HfO_2$ under special film-forming conditions including a high temperature and a reducing atmosphere. Moreover, that feature has been found to manifest itself more strongly if post annealing is carried out in a reducing atmosphere. This aspect can be observed by the XFAS analysis of the coordination number distribution. The (amount of Ba):(amount of oxygen vacancy)=1:1, i.e. they are equivalent to each other within an analytical error. Oxygen vacancy is easily formed near Ba under special temperature and atmosphere conditions and there is formed a stable BaVo structure. Moreover, the BaVo structures react against one another and spread uniformly through the film. As a result, the amounts of Ba and oxygen vacancy coincide with each other.

Advantages

The insulating film according to the mode of the present invention under description is formed from an oxide $HfO_2$, $ZrO_2$, $HfSiO_4$ or $ZrSiO_4$ employed as a matrix material, and further contains at least one of Ba, Sr and Mg. Therefore, the film contains a drastically reduced amount of mobile oxygen vacancies.

According to the present invention, the added element, such as Ba, increases the amount of oxygen vacancies in the oxide, but fixes them firmly. Moreover, it does not cause any narrowing of the band gap at all or produce any impurity level in the band gap at all.

Therefore, the present invention provides an insulating film allowing only a small amount of leakage current and having a high degree of long-term reliability. More specifically, (1) it can maintain an amorphous structure even at a high temperature, (2) its leakage current is drastically improved, since it does not cause any narrowing of the band gap or produce any impurity level in the band gap, and (3) its firm fixing of oxygen vacancies (with five or more times as much energy as when nitrogen is employed) improves its long-term reliability markedly. It does not have any fixed charge or polarization therein, either.

Any known film of $HfO_2$ or $ZrO_2$ or a silicate thereof (particularly a silicate containing over 50% of Hf or Zr) forms a large amount of oxygen vacancies, as well as fixed charge and polarization. Therefore, it has hitherto been difficult to use $HfO_2$, etc. for a gate insulating film, since remote Coulomb scattering causes a serious reduction in mobility. When an adequate amount of Ba (or Sr or Mg) is added as according to the present invention, BaVo (or SrVo or MgVo) is formed to make charge compensation and prevent any fixed charge or polarization. Therefore, it is possible to put a substance such as $HfO_2$ into practical use for a gate insulating film, which has hitherto been considered difficult.

Related Art Literature

JP-A-2005-259954 is a patent relating to nitrides. On the other hand, the present invention is characterized by not employing nitrogen. The introduction of nitrogen necessarily results in the narrowing of the band gap and a greatly weakened fixing power for the amorphous state, as discussed before.

JP-A-2005-311300 discloses a ternary oxide containing two metal elements, mainly a film of aluminate (HfAlO or ZrAlO). The metal elements listed therein include Ba, Sr and Mg. However, it is obvious from the designation "ternary" that the oxide contains a large amount of metal elements. As the patent relates to a simple mixture of known dielectric materials, there is no mechanism working to induce any oxygen vacancy, but it is a patent involving an entirely different electronic state. The patent relating to a simple mixture does not require any range limitation. On the other hand, the present invention employs only a very small amount of Ba, Sr or Mg which replaces the metal element in the matrix, thereby making a compound which is nothing but "binary". Moreover, it is essential to add a specific amount of element falling within the specifically limited range. According to the present invention, a substance having a small valence (e.g. Ba) replaces the matrix metal (e.g. Hf) to induce oxygen vacancy and thereby produce an entirely different electronic state. Any deviation from the range specified by the present invention brings about a serious reduction in properties. Therefore, the present invention is entirely different from the invention disclosed in JP-A-2005-311300.

JP-A-2003-289140 is a patent relating to a gate insulating film of a silicate. It contains a description concerning the addition of Mg, but its purpose and mechanism are entirely different from the present invention and the amount in which it is added is different accordingly. JP-A-2003-289140 shows a Mg content of 1 at % or more against a Hf content of 17 at % or less. Expression (3) requires Mg to be equal to or less than $[Hf]/\{[Hf]+[Si]\} \times 1.4$ at %. The silicate according to JP-A-2003-289140 has a Hf content of 17 at % or less and therefore contains 50% or more of $SiO_2$ and 50% or less of $HfO_2$. Accordingly, the upper limit as defined by Expression (3) is 17 at %/$\{17$ at %+17 at %$\} \times 1.4$ at %=0.7 at %. Therefore, the amount of the element added according to JP-A-2003-289140 is so large that the dissociation of MgVo makes it impossible to achieve the results as stated before.

EXAMPLES

The present invention will now be described by examples embodying it, though it is not limited to the following examples unless it departs from the spirit of the present invention.

First Example

Figure 4:
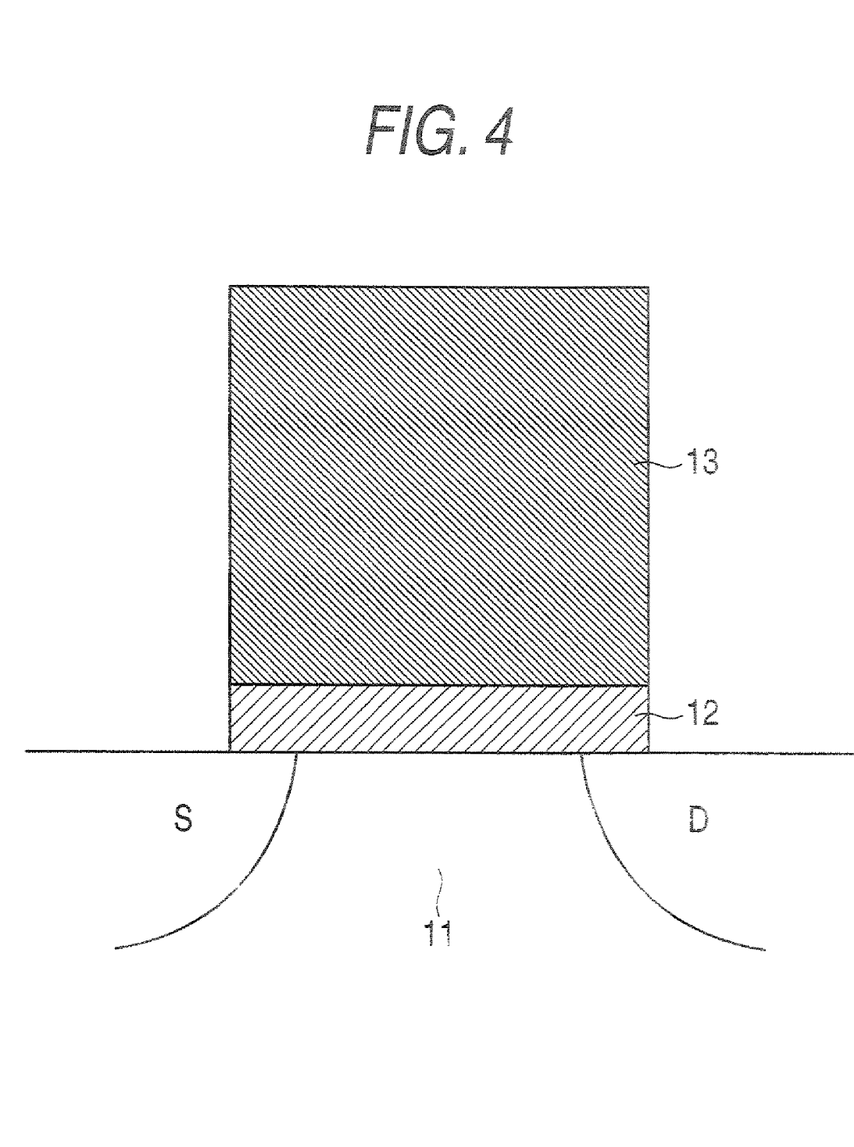
FIG. 4 is a schematic cross-sectional view showing the principal portion of the MISFET according to the first example embodying the present invention.

A MISFET containing an oxide film embodying the present invention will now be described as a first example of the present invention with reference to FIG. 4. FIG. 4 is a cross sectional view showing the principal portion of the MISFET according to the first example.

The MISFET comprises a substrate 11, a source regions, a drain region D, a gate insulating film 12 (insulating layer) and a gate electrode 13, as shown in FIG. 4. The substrate 11 is formed from, for example, silicon. The source and drain regions S and D are formed on the surface of the substrate 11. The gate insulating film 12 is formed from an oxide embodying the present invention as described below, and above a channel region formed between the source and drain regions S and D. The gate electrode 13 is formed on the gate insulating film 12.

Description will now be described of a process for manufacturing the MISFET as shown in FIG. 4. A clean surface was exposed on the principal (001) plane of the Si substrate 11. After its ordinary treatment with hydrofluoric acid (HF), a $SiO_2$ film having a very small thickness was formed thereon by ozone oxidation at room temperature and its surface was protected.

Then, the substrate 11 was conveyed to a sputtering apparatus in which impurities were removed from the outermost surface of the substrate at 250° C. in an ultrahigh vacuum and the $SiO_2$ film was, then, removed from its surface at a temperature as high as 880° C. The clean surface of the 2×1 structure was ascertained by RHEED.

A film of amorphous $HfO_2$ was formed as the gate insulating film 12 by sputtering at a high temperature of 800° C. The film had a thickness of 4 nm. Oxygen partial pressure was set at zero from the beginning of sputtering and the film was formed in a reducing atmosphere. $HfO_2$ was used as the target.

A target of $BaHfO_3$ was employed for simultaneous sputtering when the $HfO_2$ film was formed. A very small amount of Ba was sufficient. The amount of Ba was controlled by regulating the voltage applied to $BaHfO_3$. According to the present example, the $HfO_2$ film had a Ba content of 0.9 ate. After the film was formed, hydrogen was introduced for 30 seconds at 1,050° C. for annealing in a reducing atmosphere.

Although the film was formed by sputtering, substantially the same results could be obtained by employing another method, such as MBE (molecular beam epitaxial), CVD (chemical vapor deposition) or ALD (atomic layer deposition). In any event, however, it is necessary to lower oxygen partial pressure as far as possible and eventually performs annealing in a reducing atmosphere at or above 800° C. to obtain good and reliable results. Then, a film of TaSi was formed as the gate electrode 13 by sputtering. Thereafter, the source and drain regions S and D were formed by e.g. ion implantation.

The n-type MISFET produced as described and containing Ba and another n-type MISFET not containing any Ba were examined for their properties. In both of the cases, the gate insulating film 12 had a thickness (EOT) as small as 0.65 nm in terms of the $SiO_2$ film. In addition, the EOT is preferably 1.0 nm or less as shown in this embodiment.

The leakage current measured by applying an electric field strength as high as 5 MV/cm was 1.0 A/cm$^2$ or less on the MISFET not containing any Ba and showed a drastic reduction to 0.0005 A/cm$^2$ on the MISFET containing Ba. While the $HfO_2$ film not containing any Ba had fine crystals precipitated, the $HfO_2$ film containing Ba retained its amorphous structure.

Comparison will now be made with a HfON film which is a commonly used $HfO_2$ film containing nitrogen. It contained about 20 at % of nitrogen. It retained an amorphous structure. However, the leakage current measured by applying an electric field strength as high as 5 MV/cm was about 0.1 A/cm$^2$, as the film containing N retained its amorphous structure. It showed an improvement by one figure over the $HfO_2$ not containing any Ba, but was still inferior by more than one figure to the MISFET containing Ba. Thus, it is obvious that the $HfO_2$ containing Ba allows only a very small amount of leakage current.

The main reason resides in a drop of nearly 1.0 eV occurring to the band offset on the conduction band when nitrogen is added to $HfO_2$. As no such drop occurs to the band offset when Ba is added, it is now apparently possible to utilize the original band offset of $HfO_2$.

Referring to the change which occurred with the passage of time when a voltage (1 MV/cm) was applied, breakdown occurred within several hours when no Ba was employed, and in about eight hours when nitrogen was employed. On the other hand, three days passed without seeing any breakdown when Ba was employed.

A shift of the threshold voltage with the passage of time occurred markedly to the MISFET not containing any Ba and a shift of about 100 mV or more was observed in about an hour. A shift of 100 mV was observed in eight hours on the MISFET containing nitrogen. The shift which occurred to the MISFET containing nitrogen was apparently due to its weak power of fixing oxygen vacancies. On the other hand, 24 hours passed without causing a shift of more than, say, 10 mV to the MISFET containing Ba.

P-type MISFET's were likewise examined. While crystallization occurred when simple $HfO_2$ was employed, and a drop of band offset occurred when nitrogen was added to $HfO_2$, neither of them occurred, but a good p-type MISFET was obtained, when Ba was added to $HfO_2$.

The results so far stated confirm that oxygen vacancies were firmly fixed by Ba, that no narrowing of the band gap occurred, and that no level was formed in the gap. The first example shows a drastic improvement in the properties of the gate insulating film and its reliability.

Second Example

Figure 5:
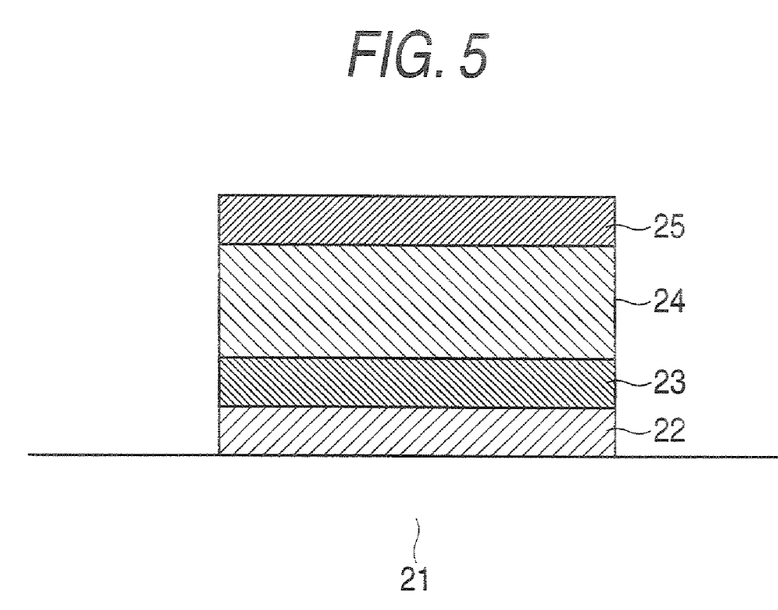
FIG. 5 is a schematic cross-sectional view showing the principal portion of the capacitor according to the second example embodying the present invention.

A MIM (metal insulator metal) capacitor formed from Pt, $ZrO_2$ containing Mg and Pt will now be described as a second example of the present invention with reference to FIG. 5. FIG. 5 is a cross sectional view showing the principal portion of the MIM capacitor according to the second example.

The MIM capacitor comprises a substrate 21 and a buffer film 22, an electrode 23, a capacitor insulating film 24 (insulating layer) and an electrode 25 which are laid on the substrate 21 one upon another in their order mentioned, as shown in FIG. 5. The substrate 21 is formed from, for example, silicon. The buffer film 22 is formed from, for example, amorphous TiAlN. The electrodes 23 and 25 are formed from, for example, Pt. The capacitor insulating film 24 is formed from $ZrO_2$ with Mg added thereto.

Description will now be described of a process for manufacturing the MIM capacitor as shown in FIG. 5. A clean surface was first exposed on the principal (001) plane of the substrate 21, in the same way as in the first example.

Then, after the buffer film 22 and the electrode 23 were formed, a film of $ZrO_2$ was formed as the capacitor insulating film 24 by sputtering at a high temperature of 800° C. The film had a thickness of 2.8 nm. oxygen partial pressure was set at zero from the beginning of sputtering.

A target of MgO was employed for simultaneous sputtering when the $ZrO_2$ film was formed. As care had to be taken not to allow the introduction of oxygen from the MgO target, sputtering was carried out in a reducing atmosphere. A very small amount of Mg was sufficient and was about 0.8 at %. The amount of Mg was controlled by regulating the voltage applied to MgO. Although the film was formed by sputtering, substantially the same results could be obtained by employing another method, such as MBE, CVD or ALD. Then, a film of Pt was formed as the electrode 25 by sputtering.

The MIM capacitor produced as described from $ZrO_2$ with Mg added thereto and another MIM capacitor produced from $ZrO_2$ without any Mg added thereto were examined for their properties. In both of the cases, the capacitor insulating film 24 had a thickness (EOT) as small as 0.45 nm in terms of the $SiO_2$ film. In addition, the EOT is preferably 3.0 nm or less as shown in this embodiment.

The leakage current measured by applying an electric field strength as high as 5 MV/cm was 1.0 $A/cm^2$ or less on the MIM capacitor produced from $ZrO_2$ without any Mg added thereto and showed a drastic reduction to 0.005 $A/cm^2$ on the MIM capacitor produced from $ZrO_2$ with Mg added thereto.

Referring to the change which occurred with the passage of time when a voltage (1 MV/cm) was applied, breakdown occurred within several hours when no Mg had been added to $ZrO_2$, but 10 times as long a time passed without seeing any breakdown when Mg had been added.

According to a capacitance-voltage (CV) diagram, the MIM capacitor produced from $ZrO_2$ without any Mg added thereto showed a large hysteresis with a charge accumulated with the passage of time, but the MIM capacitor produced from $ZrO_2$ with Mg added thereto showed a hysteresis of only 10 mV or less.

The results so far stated are apparently due to the fact that oxygen vacancies were firmly fixed by Mg, and that any lowering of electric and dielectric properties was suppressed.

Third Example

Figure 6:
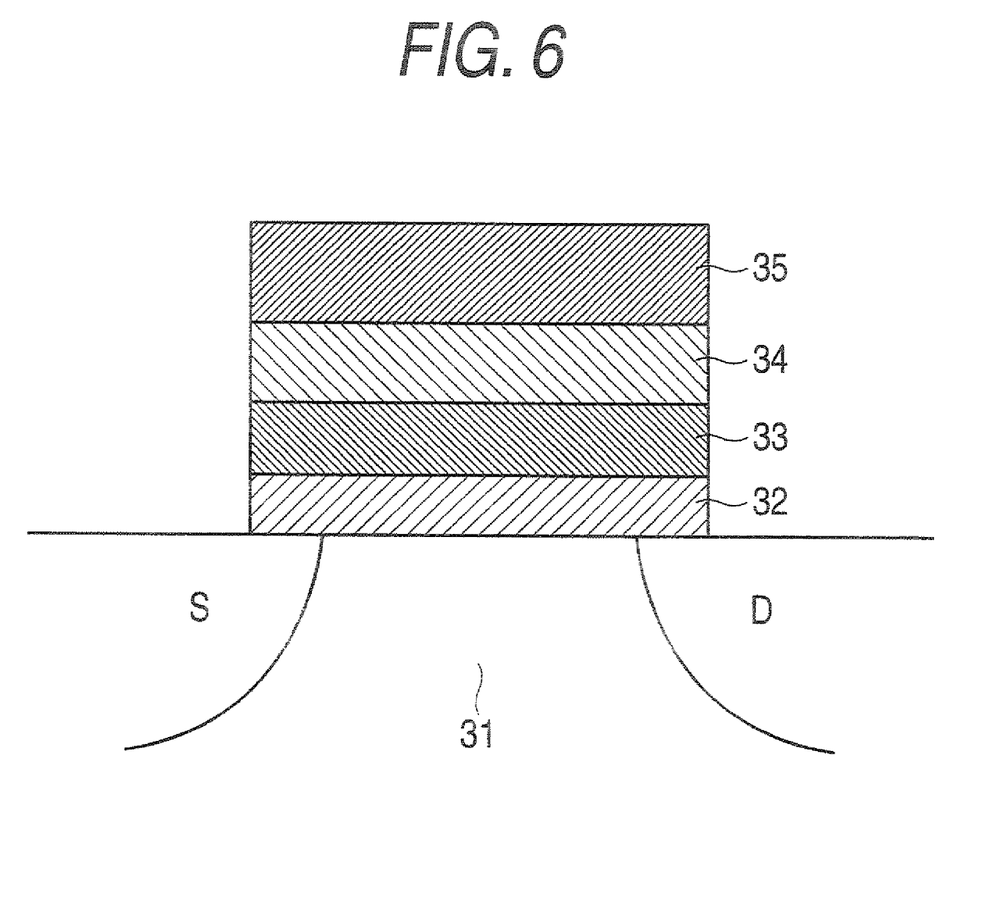
FIG. 6 is a schematic cross-sectional view showing the principal portion of the cell transistor of a flash memory according to the third example embodying the present invention.

A capacitor structure formed from polysilicon, $HfSiO_4$ and polysilicon will now be described as a third example of the present invention with reference to FIG. 6. The structure corresponds to an insulating film between the floating and control gates of a cell transistor in a flash memory (the so-called interpoly insulating film) and its neighborhood. FIG. 6 is a cross sectional view showing the principal portion of the capacitor according to the third example.

The capacitor structure comprises a substrate 31, and an insulating film 32 (first insulating layer), an electrode 33, an insulating film 34 (second insulating layer) and an electrode 35 which are laid on the substrate 31 one upon another in their order mentioned, as shown in FIG. 6. The substrate 31 is formed from, for example, silicon. The insulating film 32 is formed from, for example, amorphous SiON. The electrodes 33 and 35 are formed from polysilicon (p-dope). The insulating film 34 is formed from a Hf silicate with Sr added thereto.

Description will now be described of a process for manufacturing the capacitor according to the third example. A clean surface was first exposed on the principal (001) plane of the substrate 31, in the same way as in the first example.

Then, after the insulating film 32 and the electrode 33 were formed, a film of $HfSiO_4$ was formed as the insulating film 34 by sputtering at a high temperature of 800° C. The film had a thickness of 15 nm. Oxygen partial pressure was set at zero from the beginning of sputtering. A target of $HfSiO_4$ having a Hf:Si ratio of 1:1 was employed.

A target of $SrHfO_3$ was employed for simultaneous sputtering when the $HfSiO_4$ film was formed. A very small amount of Sr was sufficient and was 0.4 at %. The amount of Sr was controlled by regulating the voltage applied to $HfSiO_4$. Although the film was formed by sputtering, substantially the same results could be obtained by employing another method, such as MBE, CVD or ALD. Then, a polysilicon film was formed as the electrode 35 by sputtering.

Then, the source and drain regions S and D were formed on the surface of the substrate 31 by e.g. ion implantation so that the channel region under the electrode 33 might be situated therebetween, whereby the cell transistor of a flash memory was formed.

The flash memory produced as described and having its interpoly insulating film formed from Hf silicate with Sr added thereto and another flash memory having an interpoly insulating film formed from Hf silicate without any Sr added thereto were examined for their properties. In both of the cases, the interpoly insulating film 34 had a thickness (EOT) as small as 2.5 nm in terms of the $SiO_2$ film. In addition, the EOT is preferably 3.0 nm or less as shown in this embodiment.

The leakage current measured by applying an electric field strength as high as 5 MV/cm was 0.1 A/cm$^2$ or less when no Sr had been added to the Hf silicate, and showed a drastic reduction to 0.0001 A/cm$^2$ when Sr had been added thereto.

Referring to the change which occurred with the passage of time when a voltage (1 MV/cm) was applied, breakdown occurred within several hours when no Sr had been added, but 10 times as long a time passed without seeing any breakdown when Sr had been added.

According to a capacitance-voltage (CV) diagram, the insulating film formed without any Sr added thereto showed a large hysteresis with a charge accumulated with the passage of time, but the insulating film formed with Sr added thereto showed a hysteresis of only 10 mV or less.

The results so far stated are apparently due to the fact that oxygen vacancies were firmly fixed by Mg, and that any lowering of electric and dielectric properties was suppressed.

Fourth Example

Figure 7:
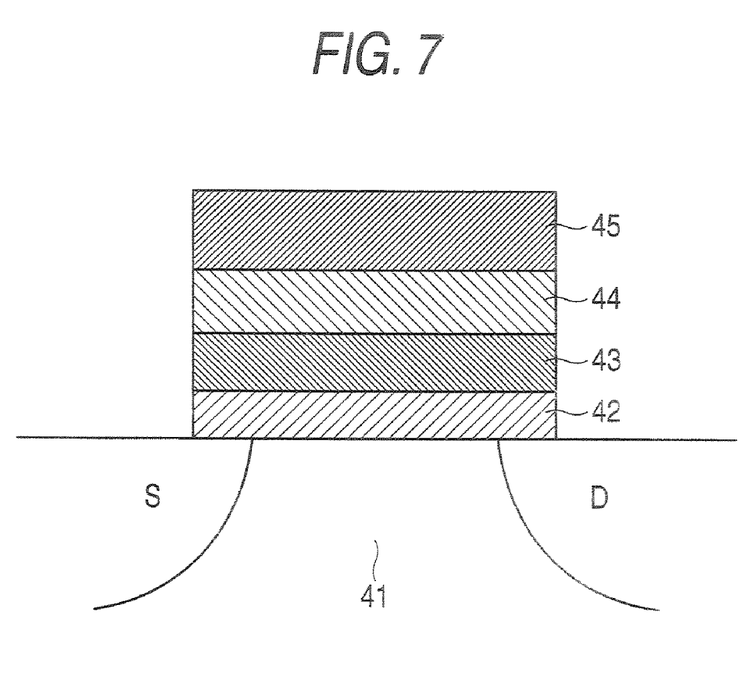
FIG. 7 is a schematic cross-sectional view showing the principal portion of the trap type flash memory according to the fourth example embodying the present invention.

Referring now to a fourth example of the present invention, a source region (S) and a drain region (D) are formed on a semiconductor substrate 41 and spaced apart from each other by a channel region defining a path for an electric current through which data are conveyed. A gate laminate controlling the operations of a memory (write, read and erase) is situated above the channel region. The distance between the source and drain regions (i.e. the length of the channel) is the distance selected in accordance with the design specifications of the memory and forms the channel region.

The gate laminate is formed by a tunnel layer 42 as a first insulating layer, a trap layer 43 as a second insulating layer, a block layer 44 as a third insulating layer and a control gate electrode 45 which are laid one upon another in their order mentioned. Each layer will now be described in detail.

The tunnel layer 42 on the channel region has two ends laid on the source and drain regions, respectively. The tunnel layer 42 is formed by e.g. a silicon oxide film having a thickness of 0.5 to 5 nm. According to the example under description, it has a thickness of 2.4 nm. The tunnel layer 42 is formed by not only a single SiO2 film, but also a silicon nitrogen oxide or nitride film, or a laminate thereof if it can maintain a low dielectric constant and a barrier. It may, for example, be a multilayer film formed from $SiO_2$, $Si_3N_4$ and $SiO_2$.

Then, a Si-rich SiN film having a thickness of 3.2 nm is formed as the second insulating layer. When a given voltage is applied to the memory control electrode 45 and the drain region, the electrons passing through the tunnel layer 42 are trapped in the charge accumulating layer 43. The trapped charge is stored in the film to operate the memory. The charge accumulating layer 43 can be formed by, for example, forming a silicon film by CVD and heat treating it in a mixed nitrogen and argon gas atmosphere. Of course, CVD is not the only method, but various other methods can be employed. The amount of nitrogen is controlled to control the trap density. The film is annealed in a mixed nitrogen and oxygen gas atmosphere.

A laminated film formed from $HfO_2$ with Ba added thereto (6 nm) and $Al_2O_3$ (3 nm) is, then, formed as the third insulating layer. The third insulating layer is called a block layer, since it blocks the electrons trapped in the second insulating layer so that they may not escape toward the electrode. The block layer formed from a highly dielectric material makes it possible to apply the greater part of applied voltage to the first insulating layer (tunnel film) 42 and achieve a satisfactory reduction of the voltage required for the operation of the memory and thereby a low-voltage drive. The use of a highly dielectric material for the charge accumulating layer enables operation at a still lower voltage. The lowering of the voltage enables a lowering of the voltage applied to the block layer and is, therefore, effective for preventing any electron injection from the electrode when stored data are erased. Thus, any electron injection from the electrode is suppressed.

The block layer 44 is a laminated film formed from a film of $HfO_2$ and Ba having a dielectric constant of 19 (and a thickness of 6 nm) and a film of $Al_2O_3$ having a dielectric constant of 10 (and a thickness of 3 nm). The first layer of $HfO_2$ and Ba for the block layer 44 can be formed by, for example, carrying out sputtering simultaneously with a target of $BaHfO_3$ and a target of $HfO_2$ in a mixed oxygen and argon gas atmosphere. It is possible to introduce a proper amount of Ba into $HfO_2$ by controlling the voltage applied to $BaHfO_3$. A very small amount of Ba is sufficient and is 0.4 at %. Although the film is formed by sputtering, substantially the same results could be obtained by employing another method, such as MBE, CVD or ALD. Then, a film of TaN is formed as the electrode 45 by sputtering.

Then, the source and drain regions S and D are formed on the surface of the substrate by e.g. ion implantation so that the channel region under the electrode might be situated therebetween, whereby the cell transistor of a flash memory is formed.

The trap type flash memory produced as described and having its block layer formed from a laminated film of $HfO_2$ with Ba added thereto and $Al_2O_3$ and another trap type flash memory having a block layer formed from a laminated film of $HfO_2$ without any Ba added thereto and $Al_2O_3$ are examined for their properties. In both of the cases, the block layer had a thickness (EOT) as small as 2.4 nm in terms of the $SiO_2$ film. The first, second and third insulating layers had a total thickness of as small as 6.4 nm. In addition, total thickness of the first insulating layer, the second insulating layer and the third insulating layer is preferably 10 nm or less as shown in this embodiment.

The memory cell produced as described is drastically improved in its speed of erasure as compared with any product having a block layer formed from a film of $HfO_2$ not having any Ba added thereto. The high speed of erasure apparently became possible, since there is no longer any electron injected from the electrode even if a high erasure voltage is employed.

The leakage current measured by applying an electric field strength as high as 5 MV/cm is 0.1 A/cm$^2$ or less when no Ba had been added to the Hf silicate, and showed a drastic reduction to 0.0001 A/cm$^2$ when Ba had been added thereto.

The results so far stated are apparently due to the fact that oxygen vacancies are firmly fixed by Ba, and that any lowering of electric and dielectric properties is suppressed. The addition of Ba can particularly be expected to enable the electron barrier of the block layer to exhibit the original power of $HfO_2$.

In the fourth embodiment, $HfO_2$ with Ba added thereto is used to configure the block layer 44, which is the third insulating layer. On the other hand, $HfO_2$ with Ba added thereto may be used to configure the charge accumulating layer 43, which is the second insulating layer. However, as mentioned previously, the block layer serves as blocking the electron trapped in the second insulating layer. Thus, in view of reduction of leakage current, the insulating layer of this embodiment is preferably used as the block layer.

In the above-mentioned embodiments of the present invention, the insulating layer tends to be configured by a laminated structure. As a result of the insulating layer being configured by the laminated structure, interface stability (prevention of an interdiffusion) and leakage property are improved.

Although the present invention has been described by way of several modes of carrying it out, the present invention is not thereby limited, but variations will be possible without departing from the scope and spirit of the invention which are defined by the claims. Various modifications of the present invention will be possible to the extent not departing from its scope and spirit when it is carried out. Moreover, various inventions may be composed by combining appropriately the component features or elements of the present invention which have been disclosed above.

What is claimed is:

1. An insulating film comprising an oxide of a metal selected from Hf and Zr, the oxide being doped by at least one of Ba, Sr and Mg; and satisfying the following formula (1):

$$0.06 \text{ at \%} \leq [Ba]+[Sr]+[Mg] \leq 1.4 \text{ at \%} \quad (1)$$

wherein [Ba] represents atomic % of Ba, [Sr] represents atomic % of Sr, and [Mg] represents atomic % of Mg.

2. The insulating film as claimed in claim 1, which satisfies the following formula (2):

$$0.13 \text{ at \%} \leq [Ba]+[Sr]+[Mg] \leq 1.0 \text{ at \%} \quad (2).$$

3. The insulating film as claimed in claim 1, wherein the oxide of the metal comprising one of $HfO_2$ and $ZrO_2$.

4. The insulating film as claimed in claim 1, wherein the metal is substituted by at least one of Ba, Sr and Mg, which is seven-coordinated by oxygen.

5. The insulating film as claimed in claim 1, wherein the amount of at least one of the Ba, Sr and Mg is equal to the amount of oxygen vacancies.

6. The insulating film as claimed in claim 1, which is amorphous.

7. A semiconductor device comprising:
a semiconductor substrate;
an insulating layer comprising an insulating film according to claim 1, and provided on the semiconductor substrate;
a gate electrode provided on the insulating layer; and
source and drain regions between which a region below the gate electrode is held on the surface of the semiconductor substrate.

8. A semiconductor device comprising:
a first electrode;
an insulating layer comprising the insulating film according to claim 1, and provided on the first electrode; and
a second electrode provided on the insulating layer.

9. A semiconductor device comprising:
a semiconductor substrate;
a first insulating layer provided on the semiconductor substrate;
a first electrode provided on the first insulating layer;
a second insulating layer provided on the first electrode;
a second electrode provided on the second insulating layer; and
source and drain regions between which a region below the first insulating layer is held on the surface of the semiconductor substrate,
wherein
at least one of the first and second insulating layers comprise an insulating film according to claim 1.

10. A semiconductor device comprising:
a semiconductor substrate;
a first insulating layer provided on the semiconductor substrate;
a second insulating layer provided on the first insulating layer;
a third insulating layer provided on the second insulating layer;
a controlling electrode provided on the third insulating layer; and
source and drain regions between which a region below the first insulating layer is held on the surface of the semiconductor substrate,
wherein
at least one of the second and third insulating layers comprise an insulating film according to claim 1.

11. An insulating film comprising a silicate of a metal selected from Hf and Zr, the silicate being doped by at least one of Ba, Sr and Mg; and satisfying the following formula (3):

$$0.06 \text{ at \%} \leq [Ba]+[Sr]+[Mg] \leq 1.4 \text{ at \%} \times [M]/\{[M]+[Si]\} \quad (3)$$

wherein [Ba] represents atomic % of Ba, [Sr] represents atomic % of Sr, [Mg] represents atomic % of Mg, [M] represents atomic % of one of the Hf and Zr, and [Si] represents atomic % of Si.

12. The insulating film as claimed in claim 11, which satisfies the following formula (4):

$$0.13 \text{ at \%} \leq [Ba]+[Sr]+[Mg] \leq 1.0 \text{ at \%}[M]/\{[M]+[Si]\} \quad (4).$$

13. The insulating film as claimed in claim 11, wherein the silicate of the metal comprises one of $HfSiO_4$ and $ZrSiO_4$.

14. The insulating film as claimed in claim 11, wherein the metal is substituted by at least one of Ba, Sr and Mg, which is seven-coordinated by oxygen.

15. The insulating film as claimed in claim 11, wherein the amount of at least one of the Ba, Sr and Mg is equal to the amount of oxygen vacancies.

16. The insulating film as claimed in claim 11, which is amorphous.

17. A semiconductor device comprising:
a semiconductor substrate;
an insulating layer comprising an insulating film according to claim 11, and provided on the semiconductor substrate;
a gate electrode provided on the insulating layer; and
source and drain regions between which a region below the gate electrode is held on the surface of the semiconductor substrate.

18. A semiconductor device comprising:
a first electrode;
an insulating layer comprising the insulating film according to claim 11, and provided on the first electrode; and
a second electrode provided on the insulating layer.

19. A semiconductor device comprising:
a semiconductor substrate;
a first insulating layer provided on the semiconductor substrate;
a first electrode provided on the first insulating layer;
a second insulating layer provided on the first electrode;

a second electrode provided on the second insulating layer; and source and drain regions between which a region below the first insulating layer is held on the surface of the semiconductor substrate, wherein at least one of the first and second insulating layers comprise an insulating film according to claim 11.

20. A semiconductor device comprising:

a semiconductor substrate;

a first insulating layer provided on the semiconductor substrate;

a second insulating layer provided on the first insulating layer;

a third insulating layer provided on the second insulating layer;

a controlling electrode provided on the third insulating layer; and source and drain regions between which a region below the first insulating layer is held on the surface of the semiconductor substrate, wherein at least one of the second and third insulating layers comprise an insulating film according to claim 11.

* * * * *